United States Patent [19]
Takeyama

[11] Patent Number: 6,109,944
[45] Date of Patent: Aug. 29, 2000

[54] IC SOCKET HAVING FORWARDLY DISPLACEABLE CONTACTS WITH UPPER AND LOWER CONTACT PIECES

[75] Inventor: Tetuso Takeyama, Tokyo, Japan

[73] Assignee: Yamaichi Electronics Co., Ltd., Tokyo, Japan

[21] Appl. No.: 09/186,631

[22] Filed: Nov. 6, 1998

[30] Foreign Application Priority Data

Dec. 1, 1997 [JP] Japan ..................................... 9-330672

[51] Int. Cl.⁷ .................................................. H01R 11/22
[52] U.S. Cl. ........................ 439/266; 439/330; 439/525; 439/884
[58] Field of Search ..................................... 439/265, 266, 439/884, 885, 330, 331, 267, 268, 269, 270, 264, 259, 525, 526

[56] References Cited

U.S. PATENT DOCUMENTS

| | | |
|---|---|---|
| 3,805,212 | 4/1974 | Landman et al. . |
| 4,189,199 | 2/1980 | Grau .......................................... 339/75 |
| 4,222,622 | 9/1980 | Griffin et al. . |
| 4,491,377 | 1/1985 | Pfaff . |
| 4,533,192 | 8/1985 | Kelley . |
| 4,623,208 | 11/1986 | Kerul et al. . |
| 4,691,975 | 9/1987 | Fukunaga et al. . |
| 4,846,704 | 7/1989 | Ikeya ......................................... 439/72 |
| 5,102,346 | 4/1992 | Soes ........................................ 439/268 |
| 5,203,725 | 4/1993 | Brunker et al. ........................... 439/636 |
| 5,240,429 | 8/1993 | Myers ....................................... 439/259 |
| 5,443,396 | 8/1995 | Tokushige ................................. 439/266 |
| 5,713,751 | 2/1998 | Funkumaga ............................... 439/266 |

FOREIGN PATENT DOCUMENTS

| | | |
|---|---|---|
| 24 31 816 | 7/1974 | Germany . |
| 50-94490 | 12/1973 | Japan . |
| 53-43876 | 4/1978 | Japan . |
| 56-45581 | 4/1981 | Japan . |
| 60-81654 | 6/1985 | Japan . |
| 3-24035 | 4/1991 | Japan . |
| 2 039 160 | 7/1980 | United Kingdom . |

Primary Examiner—Gary F. Paumen
Assistant Examiner—Truc Nguyen
Attorney, Agent, or Firm—Wenderoth, Lind & Ponack, L.L.P.

[57] ABSTRACT

An IC socket includes a socket body, an IC package receiving portion formed in the socket body and adapted to receive an IC package therein, a plurality of contacts arranged in array along the IC package receiving portion, and a mechanism for resiliently displacing the contacts between a forward displacement position where the contacts are capable of contacting corresponding terminals of the IC package and a backward position where the contacted-relation between the contacts and the terminals can be canceled. Each of the contacts includes an upper contact piece and a lower contact piece supported by a common first spring portion for causing the contact to be displaced forwardly and backwardly. At least one of the upper contact piece and the lower contact piece can be resiliently displaced upwardly and downwardly by a second spring portion, and the terminal is pinchingly held under pressure between the upper contact piece and the lower contact piece when the contact is displaced forwardly, through the common first spring portion.

12 Claims, 8 Drawing Sheets

FIG.2A
FIG.2A'
FIG.2B
FIG.2C
FIG.2B'
FIG.2D
FIG.2E
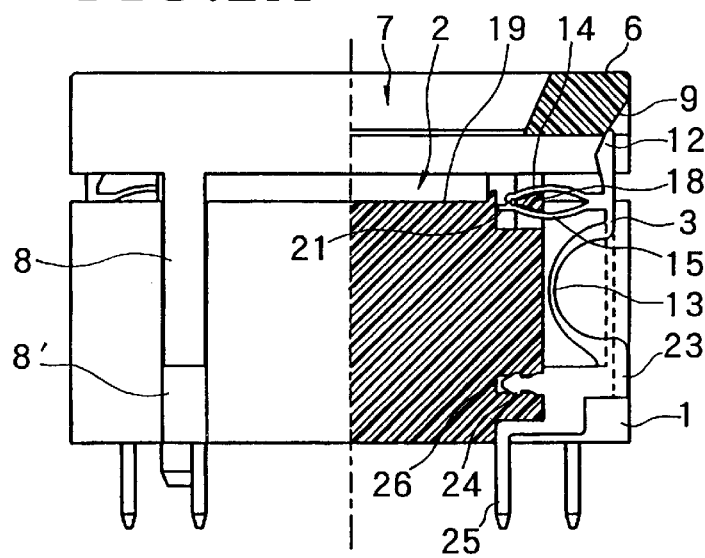
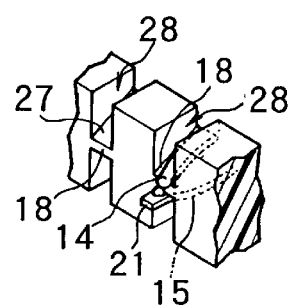
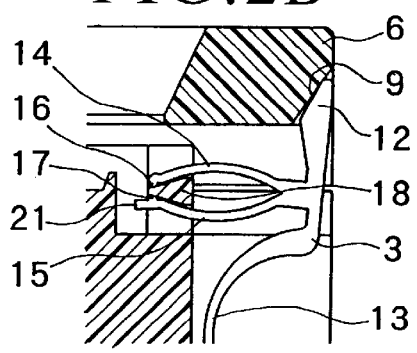
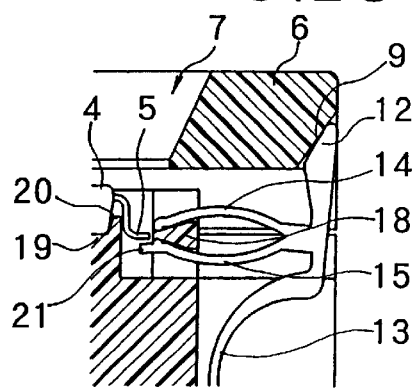
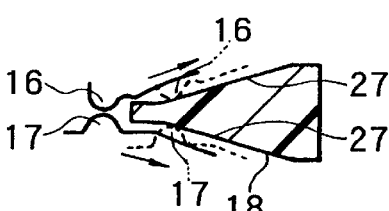
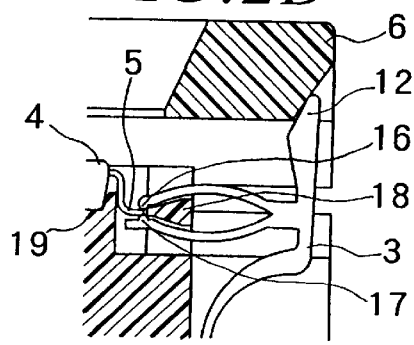
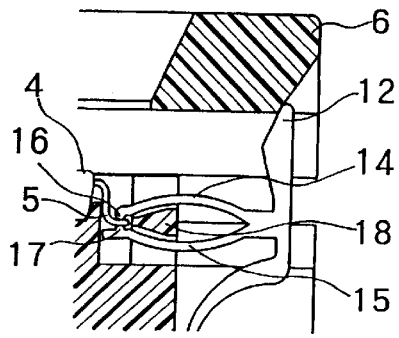

IC SOCKET HAVING FORWARDLY DISPLACEABLE CONTACTS WITH UPPER AND LOWER CONTACT PIECES

BACKGROUND OF THE INVENTION

1. Field of the Invention

This invention relates to an IC socket having contacts displaceable forwardly to establish a contacted-relation with respect to corresponding terminals of an IC package and displaceable backwardly to cancel the contacted-relation between the contacts and the corresponding terminals, and more particularly to a contacting structure between terminals and contacts.

2. Related Art

In Japanese Patent Publication No. Hei 3-24035, there is disclosed an IC socket in which one pair of pinch-holder pieces raised in parallel relation from a basal portion of each contact such that the pinch-holder pieces are can be resiliently displaced forwardly and backwardly through their own springs. This pinch-holder piece pair pinchingly holds the upper and lower surfaces of the terminals of the IC package, thereby providing an IC socket of a two-point contact structure. At that time, the opposing inner pinch-holder pieces are fixed in a state that resilient force in the opposing direction is accumulated and abutted with lower surfaces of the corresponding terminals, while only the outer pinch-holder pieces are resiliently displaced forwardly and backwardly in response to the upward and downward motion of the contact opening/closing member (canceling member) so as to contact under pressure upper surfaces of the IC terminals when they are displaced forwardly, thereby establishing the two-point contact structure between the inner pinch-holder pieces and the outer pinch-holder pieces.

However, since signals flow through the spring portions of the inner pinch-holder pieces and the spring portions of the outer pinch-holder pieces in the above two-point contact structure, it is practically difficult to design the spring portions equal with lengths in order to fulfill the necessity of obtaining displacing component for a contacted-relation and a contact canceled-relation by the spring portions forming the outer pinch-holder pieces, although the line length and the sectional area of the respective spring portions are desirably equal.

That is, as shown in FIG. 5 of the prior art JP 03-24035 document, it is necessary for the prior art to form a curved spring portion on the outer pinch-holder portion in order to obtain a sufficient spring length and therefore, a significant difference in line length occurs inevitably between the inner pinch-holder piece and the outer pinch-holder piece. As a consequence, electric signals tends to flow through the inner pinch-holder piece having a short line length (spring length), thereby reducing the effect of the two-point contact structure.

On the contrary, if the line length of the inner and outer pinch-holder pieces is designed equal as in FIG. 3 of the prior art JP 3-24035 document, a sufficient length of the spring portion for supporting the outer pinch-holder piece cannot be obtained and the force for operating the canceling member for the purpose of causing the forward and backward displacement in response to the upward and downward motion becomes excessively large, with a result that a permanent deformation occurs due to repeated deformation.

More specifically, as shown in FIGS. 3 and 4 of U.S. Pat. No. 4,691,975 which is based on the prior art, in case both the inner and outer pinch holder-pieces are each provided with a curved spring portion, the line length can be designed equal. However, since the curved spring portions are superimposed, it gives rise to another problem that the contacts and the socket become large in size.

Moreover, in the prior art, no wiping action of the contacts can be expected with respect to the IC terminals, and it is utterly impossible to obtain a wiping action of the contacts with respect to the upper and lower surfaces of the IC terminals.

The present invention has been made in view of the above situation.

SUMMARY OF THE INVENTION

It is, therefore, a general object of the present invention to obviate the above-mentioned problems inherent in the conventional devices.

To achieve the above object, there is essentially provided an IC socket comprising a socket body, with an IC package receiving portion adapted to receive an IC package therein, a plurality of contacts arranged in array along the IC package receiving portion, and means for resiliently displacing the contacts between a forward displacement position where the contacts are capable of contacting corresponding terminals of the IC package and a backward (or rearward) position where the contacted-relation between the contacts and the terminals can be canceled. Each of the contacts includes an upper contact piece and a lower contact piece supported by a common first spring portion for causing the contact to be displaced forwardly and backwardly (i.e., rearwardly). At least one of the upper contact piece and the lower contact piece can be resiliently displaced upwardly and downwardly by a second spring portion, and the terminal is pinchingly held under pressure between the upper contact piece and the lower contact piece when the contact is displaced forwardly, through the common first spring portion.

In a preferred embodiment, the IC socket further comprises a cam member for displacing the upper contact piece upwardly and the lower contact piece downwardly when the contact is displaced backwardly and for displacing the upper contact piece downwardly and the lower contact piece upwardly when the contact is displaced forwardly.

In another preferred embodiment, the IC socket comprises a cam member for displacing the upper contact piece upwardly when the contact is displaced backwardly and for displacing the upper contact piece downwardly when the contact is displaced forwardly.

In a further preferred embodiment, the IC socket comprises a cam member for displacing the lower contact piece downwardly when the contact is displaced backwardly and for displacing the lower contact piece upwardly when the contact is displaced forwardly.

It is preferred that the lower contact piece is provided at a distal end thereof with a terminal support portion projecting beyond a distal end of the upper contact piece and adapted to support a lower surface of the terminal.

It is also preferred that the upper and lower contact pieces effect a wiping action with respect to an upper and a lower surface of the terminal when the contact is displaced forwardly.

A more complete application of the invention and many of the attendant advantages thereof will be readily recognized obtained as the same becomes better understood by reference to the following detailed description when considered in connection with the accompanying drawings.

BRIEF DESCRIPTION OF THE DRAWING

FIGS. 2(A)–2(E) are partially sectional side views of a second embodiment of the present invention, namely, an IC socket for opening/closing an upper and a lower contact piece using a cam member, with FIGS. 2(B)–2(E) showing a sequential operation, FIG. 2(A') is an enlarged perspective view of a cam member and FIG. 2(B') is an enlarged side view for explaining an opening and closing action made by the cam member with respect to the upper and lower contact pieces;

DETAILED DESCRIPTION OF THE INVENTION

Figure 1A:
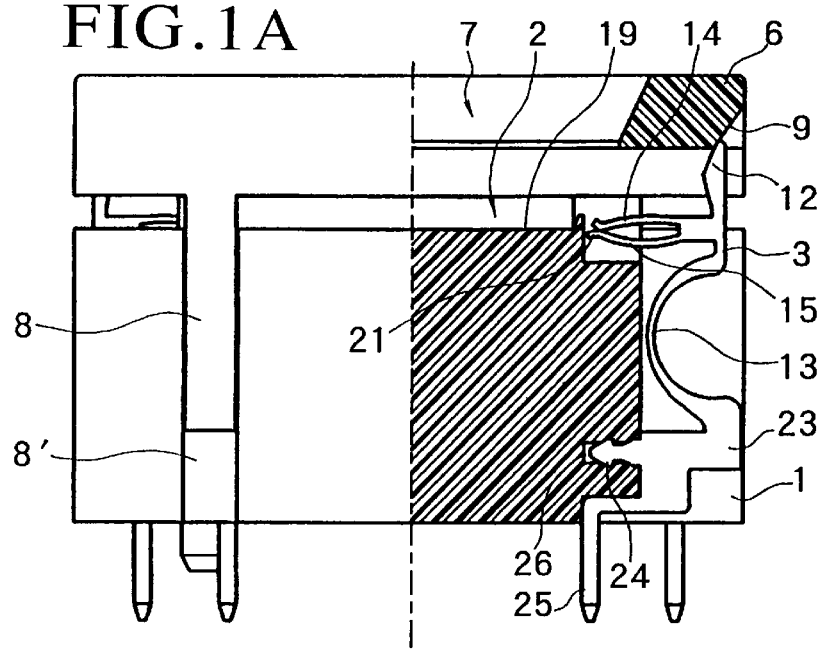
FIGS. 1(A) to 1(D) are partially sectional side views of a first embodiment of the present invention, namely, an IC socket for opening/closing an upper and a lower contact piece without using a cam member, with FIGS. 1(B)–1(D) showing a sequential operation, and FIG. 1(D') is an enlarged side view for explaining a wiping action of the upper and lower contact pieces with respect to an IC terminal.

Embodiments of the present invention will now be described in great detail with reference to FIGS. 1 to 8 of the accompanying drawings.

As shown in FIGS. 1 to 8, a socket body 1 includes an IC receiving portion 2 formed in a central portion on an upper surface of the socket body 1, and a plurality of contacts 3 arranged in array along two or four opposing sides of the IC receiving portion 2.

The contacts 3 can be resiliently displaced forwardly and backwardly (i.e. rearwardly). They are brought into contact under pressure with corresponding terminals 5 arranged on an IC package 4 when they are displaced forwardly and brought out of contact with the corresponding terminals 5 when they are displaced backwardly. As a means for displacing the contacts 5 forwardly and backwardly, the socket body 1 is provided on an upper portion thereof with a contact opening/closing member 6. This contact opening/closing member 6 exhibits a generally frame-like configuration. The member 6 has a central opening 7 confronting the top of the IC receiving portion 2. The IC package 4 is received in and removed from the IC receiving portion 2 through this central opening 7 so as to establish or cancel the contacted-relation between the contacts 3 and the corresponding terminals 5.

The contact opening/closing member 6 is provided with a vertical guide portion 8 formed along a frame wall. For guiding an upward and downward motion of the contacts, the vertical guide portion 8 is slidably fitted to a vertical guide portion 8' formed in an outer side surface of the socket body 1.

This contact opening/closing member 6 is provided on its frame wall with a cam portion 9 for opening and closing contacts arranged in correspondence with the array of the contacts 3. The opening/closing member 6 is moved downwardly to cause the cam portion 9 to act on the contacts 3 so that each array of contacts 3 is resiliently displaced backwardly as a group, to establish a contacted-relation canceled state with respect to the terminals 5. The opening/closing member 6 is moved upwardly to cause each array of contacts 3 to be resiliently displaced forwardly, to thereby establish a pressure pinchingly holding state with respect to the terminals 5.

This contact opening/closing member 6 is supported and raised by a return spring for biasing the member 6 upwardly, or the contacts 3 are displaced forwardly by resilient force accumulated when the contacts 3 are displaced backwardly so that the contact opening/closing member 6 is raised by the forward displacing force.

Figure 7:
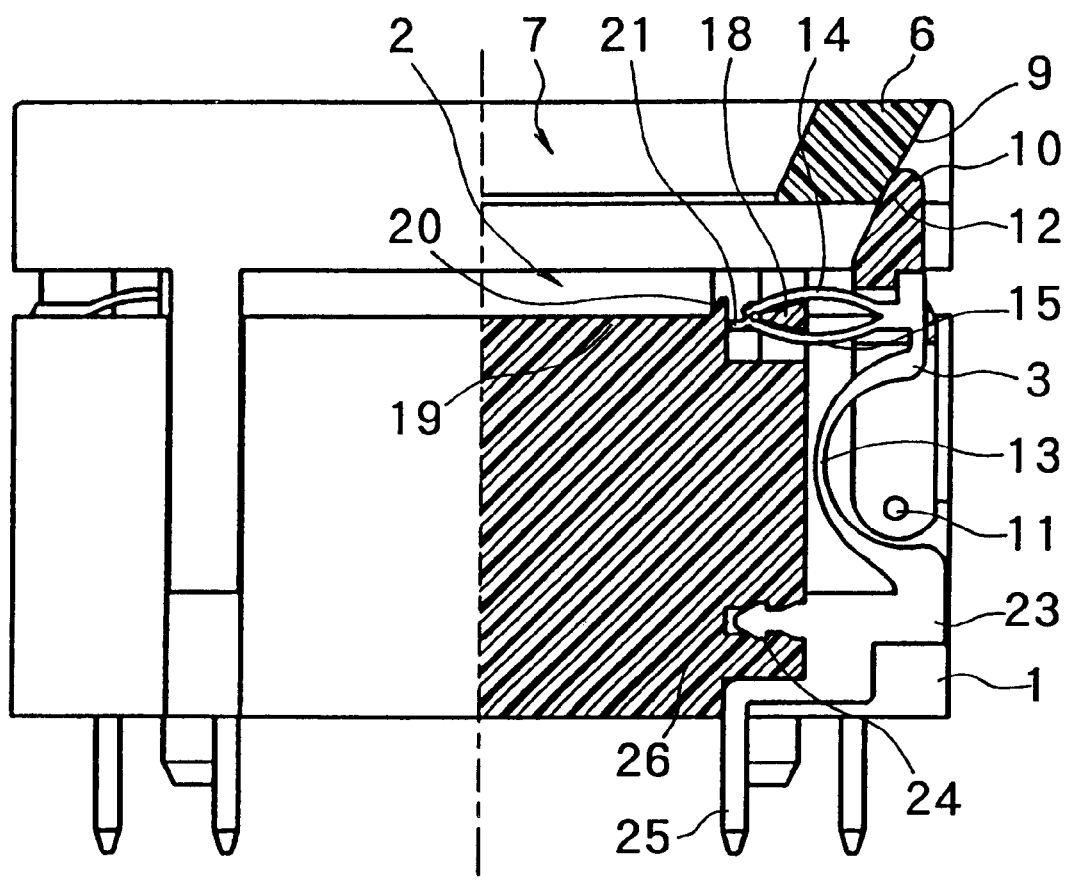
FIG. 7 is a partially sectional side view showing a contact displacing means employed in a socket according to another embodiment of the present invention.
Figure 8:
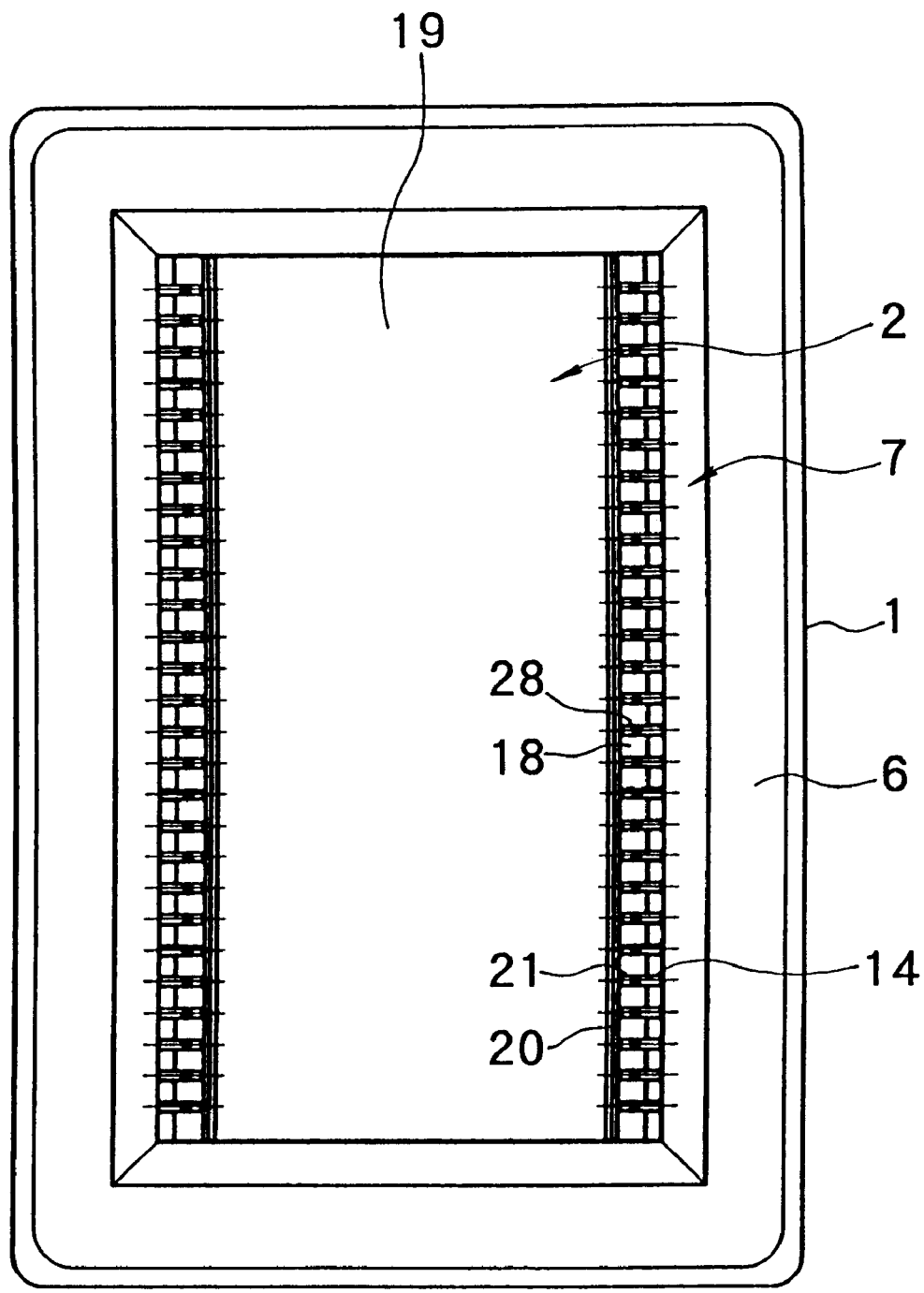
FIG. 8 is a plan view of the IC socket.

As a means for causing the cam portion 9 formed on the contact opening/closing member 6 to act on the contacts 3, as shown in FIG. 7, a motion transmitting member represented by a contact opening/closing lever 10 is provided on the socket body 1 such that the lever 10 can turn about a pin 11. The lever 10 is disposed horizontally along each array of the contacts and engaged with the contacts, such that when the contact opening/closing member 6 is lowered to cause the cam portion 9 to push a pressure receiving portion 12 formed on an end portion of the contact opening/closing lever 10, the lever 10 is turned in one direction guided by the cam portion 9 to cause each array of contacts 3 to be displaced backwardly against the resiliency of a first spring portion 13. When the force for depressing the contact opening/closing member 6 is removed, the contact opening/closing member 6 is raised through the cam portion 9 while turning the lever 10 in the other direction by a forward restoring force of the spring portion 13.

That is, FIG. 7 shows an example in which the contact 3 is resiliently displaced through a motion transmitting member, such as the opening/closing lever 10, for transforming the upward and downward motion of the member 6 to a forward and backward motion of the contact 3.

On the other hand, as shown in FIG. 1 as well as elsewhere, the cam portion 9 of the contact opening/closing member 6 is caused to act directly on a pressure receiving portion 12 integrally formed, by blanking, on an upper end or an intermediate portion of the contact 3 so that the contact 3 is displaced forwardly and backwardly.

It is accepted that instead of the provision of the contact opening/closing member 6, a jig provided on a working end of a robot may be caused to act on the pressure receiving portion 12 of the contact 3 or on the pressure receiving portion 12 of the lever 10 so that the contact 3 is displaced forwardly and backwardly.

The contact 3 includes an upper contact piece 14 and a lower contact piece 15 which are supported by a single common first spring portion 13. The contact 3 has a rigid basal portion 23 on the lower end of the first spring portion 13. A press-fit pawl 24 projects inwardly from the basal portion 23. This press-fit pawl 24 is press-fitted in a press-fit hole 26 open, for example, to a side surface of a terminal support base 19 as later described so that the contact as a whole is fixed to the socket body. A male terminal 25 projects downwardly from the basal portion 23 so as to be connected to a wiring circuit board, or the like.

The lower contact piece 15 is provided on a distal end thereof with a terminal support portion 21 projecting beyond a distal end of the upper contact element 14 so as to support a lower surface of the contact 5. This terminal support portion 21 supports a lower surface of the terminal 5 when the IC package 4 is placed in the IC receiving portion 2. Or, when the contact 3 is displaced forwardly after the IC package 4 is placed in the IC receiving portion 2, the terminal support portion 21 supports a lower surface of the terminal 5 before the upper contact piece 14 contacts the terminal 5.

The first spring portion 13 is a spring element adapted chiefly to cause the upper contact piece 14 and the lower contact piece 15 to be displaced forwardly and backwardly.

The first spring portion 13 is formed of a forwardly expanding curved spring as shown by a solid line of FIG. 2(A) or it is formed of a generally vertically linear spring as shown by a dotted line of FIG. 2(A). As later described, it may be designed such that either both or one of the upper and lower contact pieces 14, 15 is vertically displaceable and the upper and lower contact elements 14, 15 are provided with an upward and downward motion component, whereby the first spring portion 13 can be designed into a generally vertically linear configuration.

It is also accepted that the first spring portion 13 is provided on its upper end with the upper and lower contact pieces 14, 15 continuous with each other or the first spring portion 13 is provided on its upper end with the upper contact piece 14 and on a nearby area of its upper end with the lower contact piece 15, so that the first spring portion 13 is partly interposed between the first contact piece 14 and the second contact piece 15.

The present invention also includes an arrangement in which the first spring portion 13 is provided on its upper end with a rigid connecting portion and the upper and lower contact pieces 14, 15 are continuous with an upper end of the rigid connecting portion.

The upper contact piece 14 and the lower contact piece 15 are allowed to extend forwardly in a vertical 14 opposed relation. The contact pieces 14, 15 are provided on inner surfaces of their free ends (forward ends) with contact portions 16, 17, respectively. The contact portions 16, 17 may be formed of projections projecting in opposing directions from the inner surfaces of the contact pieces 14, 15. The contact portions 16, 17 are normally held in abutment by resilient force of the upper and lower contact pieces 14, 15. Thus, the upper and lower contact pieces 14, 15 are normally held in a state where the resilient force is accumulated.

As shown in FIGS. 1 and 2, the upper contact piece 14 and the lower contact piece 15 are each formed of a cantilevered arm (this arm is referred to as the second spring portion) having a spring characteristic, so that they can be vertically resiliently displaced (opened and closed with respect to each other). In this case, each of the contact pieces 14, 15 is formed generally over its entire length of a comparatively narrow cantilevered arm having a spring characteristic as mentioned above. In the alternative, both of the contact pieces 14, 15 are respectively formed of rigid cantilevered arms and basal portions of their arms are supported by connecting pieces (those pieces are referred to as the second spring portions), so that they can be resiliently vertically displaced.

As another example, as shown in FIGS. 3 and 4, only the upper contact portion 14 is formed of the cantilevered arm (second spring portion) having a spring characteristic or the upper contact piece 14 is formed of the rigid cantilevered arm and its basal portion is supported by the connecting piece (second spring portion) having a spring characteristic, so that they can be vertically resiliently displaced. This connecting piece is disposed between the upper contact piece 14 and the first spring portion 13.

As still another example, as shown in FIGS. 5 and 6, only the lower contact portion 15 is formed of the cantilevered arm (second spring portion) having a spring characteristic or the lower contact piece 15 is formed of the rigid cantilevered arm and its basal portion is supported by the connecting piece (second spring portion) having a spring characteristic, so that they can be vertically resiliently displaced. This connecting piece is disposed between the lower contact piece 15 and the first spring portion 13.

As previously mentioned, the upper and lower contact pieces 14, 15 are forwardly and backwardly resiliently displaceably supported by the single first spring portion 13. Owing to this feature, when the first spring portion 13 is flexed against its resiliency, the upper and lower contact pieces 14, 15 are displaced backwardly in synchronism. In contrast, the upper and lower contact pieces 14, 15 are displaced forwardly in synchronism by a restoring force of the common first spring portion 13. The upper and lower contact pieces 14, 15 are caused to pinchingly hold the terminal 5 of the IC package 4 to contact under pressure its upper and lower surfaces while at least one of the upper and lower contact piece 14, 15 is vertically resiliently displaced. When displacing forwardly, the contact portions 16, 17 are slid while pinchingly holding the upper and lower surfaces of the terminal 5 by the resilient force of the first spring portion 13, thereby exhibiting a wiping action.

As a means for vertically resiliently displacing either both or one of the upper and lower contact pieces 14, 15, a cam member 18 may be employed as shown in FIGS. 2, 4 and 6. This cam member 18 is interposed, for example, between the upper contact piece and the lower contact piece 15 and arranged proximate to the contact portions 16, 17. The contact portion 16, 17 are in a closed standby position when they are disengaged from the forward end of the cam member 18.

In the alternative, as shown in FIGS. 1, 3 and 5, the terminal 5 may be pinchingly held between the upper contact piece 14 and the lower contact piece 15 while forcibly opening the end portions of the upper and lower contact pieces 14, 15 by the end portion of the terminal 5, without using the cam member 18.

The construction of the present invention will now be described in more detail with reference to FIGS. 1 and 2. FIGS. 1 and 2 show a sequence of operations in case both the upper and lower contact pieces 14, 15 are vertically resiliently displaced. FIG. 2 shows an embodiment in which the upper and lower contact pieces 14, 15 are opened and closed (vertical displacement) by the cam member 18, and FIG. 1 shows another embodiment in which this cam member 18 is not used.

As shown in FIG. 1(A), the upper and lower contact pieces 14, 15 are moved into the forwardly displaced position for standby by the restoring force of the first spring portion 13.

Figure 1B:
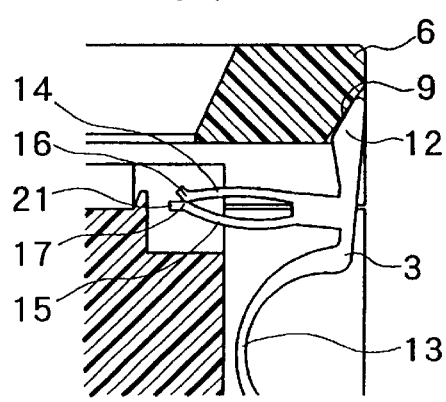

Then, as shown in FIG. 1(B), the contact opening/closing member 6 is lowered to cause the contact 3 to be displaced backwardly so that the IC receiving portion 2 is opened.

That is, the first spring portion 13 is flexed backwardly against its resiliency, to thereby displace the upper and lower contact pieces 14, 15 supported by this first spring portion 13 backwardly in synchronism, so that the IC receiving portion 2 is opened.

Figure 1C:
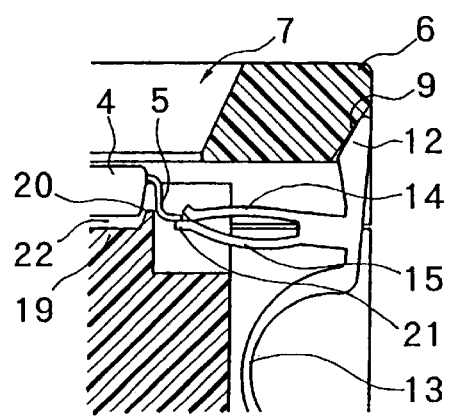

Then, as shown in FIG. 1(C), the IC package 4 is received in the IC receiving portion 2 through the central opening 7.

The IC receiving portion 2 is provided on its bottom portion with the IC support base 19. The lower surface of the IC package 4 is supported by the upper surface of this IC support base 19, or the terminal 5 is placed on the terminal support portion 21 provided on the lower contact piece 15 as illustrated. There are provided positioning ridges 20 along opposing two or four opposing sides of the IC support base 19. The IC package 4 is restricted at its side surfaces by the positioning ridges 20. The terminals 5 projecting from the side surfaces of the IC package 4 allow their distal end portions to project outwardly over the positioning ridges 20.

Figure 1D:
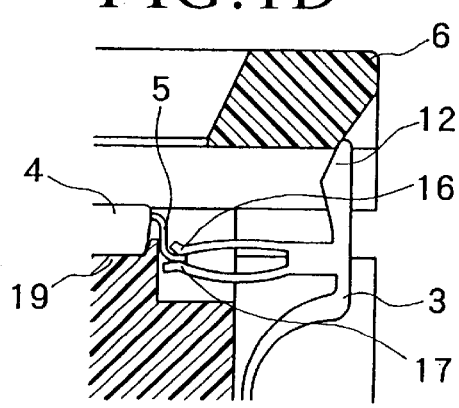
Figure 1D:
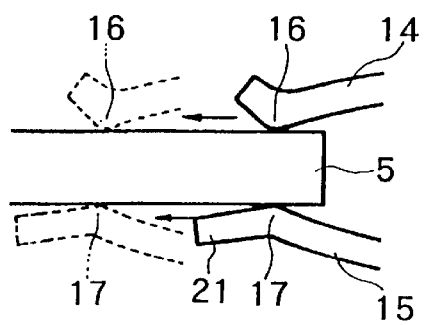

Then, as shown in FIG. 1(D), when the force for depressing the contact opening/closing member 6 is removed, the contact 3 is forwardly resiliently displaced by the restoring force of the first spring 13 while pushing up the opening/closing member 6.

This forward resilient displacement of the contact 3 causes the distal end of the terminal 5 to abut between the distal end of the upper contact piece 14 and the distal end of the lower contact piece 15. When the contact 3 is caused to be continuously forwardly resiliently displaced, the terminal 5 is pinchingly held under pressure between the upper contact piece 14 and the lower contact piece 15 while the contact pieces 14, 15 are forcibly opened by the terminal 5.

At that time, as shown in FIG. 1(D'), the contact portions 16, 17 are slid from the distal end of the terminal towards its basal portion with the upper and lower surfaces of the terminal 5 pinchingly held between the contact portions 16 and 17, whereby the upper and lower contact pieces 14, 15 exhibit a wiping action along the terminal 5.

In FIG. 1(C), when the terminal 5 of the IC package 4 is placed on the terminal support portion 21 formed on the distal end of the lower contact piece 15, a gap 22 is formed between the upper surface of the IC support base 19 and the IC package 4 and the IC package 4 is supported by the IC support base 19 in a floating manner.

As shown in FIG. 1(D), when the terminal 5 is pinchingly held under pressure between the upper contact piece 14 and the lower contact piece 15, the upper and lower contact pieces 14, 15 are pivoted slantwise forwardly downwardly such that the upper contact piece 14 pushes the terminal downwardly while holding the terminal 5 between the upper contact piece 14 and the lower contact piece 15, whereby the IC package 4 is lowered and supported by the upper surface of the IC support base 19. This further enhances the wiping action.

In the state of FIG. 1(D), when the opening/closing member 6 is lowered, the contact 3 is displaced backwardly to cause the upper and lower contact pieces 14, 15 to be displaced backwardly while sliding on the upper and lower surfaces of the terminal 5, whereby the contact 3 exhibits a wiping action again with respect to the upper and lower surfaces of the terminal 5. A backward displacement of the contact 3 cancels the contacted relation with the IC terminal 5 and opens the IC receiving portion, so that the IC package 4 can be removed.

The example using the cam member 18 will now be described with reference to FIG. 2.

As shown in FIG. 2(A), the upper and lower contact pieces 14, 15 are displaced forwardly for standby, by the restoring force of the first spring portion 13.

Then, as shown in FIG. 2(B), the contact opening/closing member 6 is lowered to cause the contact 3 to be displaced backwardly so that the IC receiving portion 2 is opened.

That is, the first spring portion 13 is flexed backwardly against its resiliency, to thereby displace the upper and lower contact pieces 14, 15 supported by this first spring portion 13 backwardly in synchronism, so that the IC receiving portion 2 is opened. A cam member 18 is disposed proximate to the contact portions 16, 17, between the upper contact piece 14 and the lower contact piece 15.

This cam member 18 is integral with the socket body 1 in such a manner as to extend along the array of contacts 3. And the cam member 18 is interposed between the upper contact piece 14 and the lower contact piece 15 as mentioned above.

For example, as shown in FIG. 2(A'), the IC support base 19 is provided with the cam member 18 having a contact piece restricting groove 28 for receiving therein the upper and lower contact pieces 14, 15 of each contact 3 at an area confronting the upper and lower contact pieces 14, 15. The upper and lower contact pieces 14, 15 are received in the contact piece restricting groove 28 and a cam face 27 to be described hereinafter is formed on the inner bottom surface of the groove 28, so that the upper and lower contact pieces 14, 15 are opened and closed.

As shown in FIG. 2(B'), the cam member 18 is provided on its upper and lower surfaces with one pair of slanted cam faces 27 which diverge backwardly, that is, which are reduced converge forwardly. When the contact 3 is displaced backwardly together with the upper and lower contact pieces 14, 15, the contact portions 16, 17 of the upper and lower contact pieces 14, 15 are resiliently displaced as guided by the slanted cam faces 27 such that the upper contact piece 14 is resiliently upwardly displaced and the lower contact piece 15 is resiliently downwardly displaced, whereby the upper and lower contact pieces 14 and 15 are opened.

The upper and lower contact pieces 14, 15 are in their closed position when they are brought away from the forward end of the cam member 18. In this closed position, the contact portions 16, 17 are caused to climb over the slanted cam faces 27 when the contact 3 is displaced backwardly, whereby the above-mentioned opened state is realized.

As shown in FIG. 2(C), the IC package 4 is received in the IC receiving portion 2 through the central opening 7.

As previously mentioned, the IC receiving portion 2 is provided on its bottom portion with the IC support base 19. The lower surface of the IC package 4 is supported by the upper surface of the IC support base 19 or the terminal 5 are placed on the terminal support portions 21 provided on the lower contact pieces 15 as illustrated. Positioning ridges 20 are provided along the two or four opposing sides of the IC support base 19, so that the side surfaces of the IC package 4 are restricted by the positioning ridges 20. The terminals 5 projecting from the side surfaces of the IC package 4 allow their distal end portions to project outwardly over the positioning ridges 20.

Then, as shown in FIG. 2(D), when the force for depressing the contact opening/closing member 6 is removed, the contact 3 is forwardly resiliently displaced by the restoring force of the first spring 13 while pushing up the opening/closing member 6.

This forward resilient displacement of the contact 3 causes the contact portions 16, 17 of the upper and lower contact pieces 14, 15 to be slid forwardly on the slated cam faces of the cam member 18, so that the upper contact piece 14 is downwardly resiliently displaced and the lower contact piece 15 is upwardly resiliently displaced, by the restoring force thereof, thereby pinchingly holding the upper and lower surfaces of the distal end portion of the terminal 5 at a location away from the distal end of the cam member 18.

When the contact 3 is continuously forwardly resiliently displaced, as shown in FIGS. 2(E) and 1(D'), the contact portions 16, 17 are slid from the distal end of the terminal toward the basal portion while pinchingly holding under pressure the upper and lower surfaces of the terminal 5 between the contact portion 16 and the contact portion 17, whereby a wiping action is exhibited.

In the state of FIG. 2(C), the terminal 5 of the IC package 4 can be placed on the terminal support portion 21 provided on the distal end of the lower contact piece 15 as in the previously-mentioned case. At that time, a gap 22 is formed between the upper surface of the IC support base 19 and the IC package 4, whereby the IC package 4 is supported by the IC support base 19 in a floating manner. Then, as shown in FIG. 2(D), when the terminal 5 is pinchingly held under pressure between the upper contact piece 14 and the lower contact piece 15, the upper and lower contact pieces 14, 15 are pivoted slantwise forwardly and downwardly such that the upper contact piece 14 pushes the terminal downwardly while holding the terminal 5 between the upper contact piece 14 and the lower contact piece 15, whereby the IC package 4 is lowered and supported by the upper surface of the IC support base 19. This further enhances the wiping action.

In the state of FIG. 2(E), when the opening/closing member 6 is lowered, the contact 3 is displaced backwardly to thereby cause the upper and lower contact pieces 14, 15 to be displaced backwardly while sliding on the upper and lower surfaces of the terminal 5, whereby a wiping action is exhibited again with respect to the upper and lower surfaces. When the contact 3 is displaced backwardly, the contacted relation with the IC terminal 5 is canceled and the IC receiving portion 2 is opened, so that the IC package 4 can be removed.

Another embodiment of the present invention will now be described in more detail with reference to FIGS. 3 and 4. FIGS. 3 and 4 show a sequence of operation in cases in which the upper contact piece 14 is vertically resiliently displaceable, with FIG. 4 showing an example in which the upper contact piece 14 is vertically displaced by the cam member 18, and FIG. 3 showing another example in which the cam member 18 is not employed.

Figure 3A:
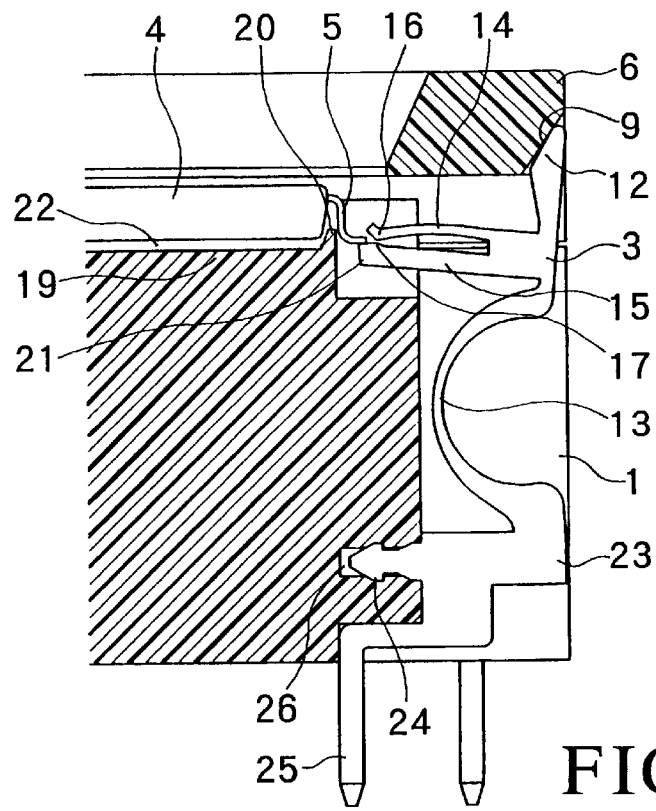
FIGS. 3(A) and 3(B) are partially sectional side views showing a third embodiment of the present invention, namely, an IC socket for opening/closing an upper contact piece without using a cam member, according to a sequential operation.

As previously mentioned, the upper and lower contact pieces 14, 15 are forwardly displaced for standby by the restoring force of the first spring portion 13. In that state, as shown in FIG. 3(A), the contact opening/closing member 6 is lowered to cause the contact 3 to be displaced backwardly so that the IC receiving portion 2 is opened.

That is, the first spring portion 13 is flexed backwardly against its resiliency, to thereby displace the upper and lower contact pieces 14, 15 supported by this first spring portion 13 backwardly in synchronism, so that the IC receiving portion 2 is opened. Then, the IC package 4 is received in the IC receiving portion 2 through the central opening 2. When the IC package 4 is received in the IC receiving portion 2, the lower surface of the IC package 4 is supported by the upper surface of the IC support base 19 as previously mentioned, or the terminals 5 are placed on the terminal support portions 21 provided on the lower contact pieces 15 as illustrated. The IC support base 19 is provided along its two or four opposing sides with the positioning ridges 20 so that the side surfaces of the IC package 4 are restricted by the positioning ridges 20. The terminals 5 projecting from the side surfaces of the IC package 4 allow their distal end portions to project outwardly over the positioning ridges 20.

Figure 3B:
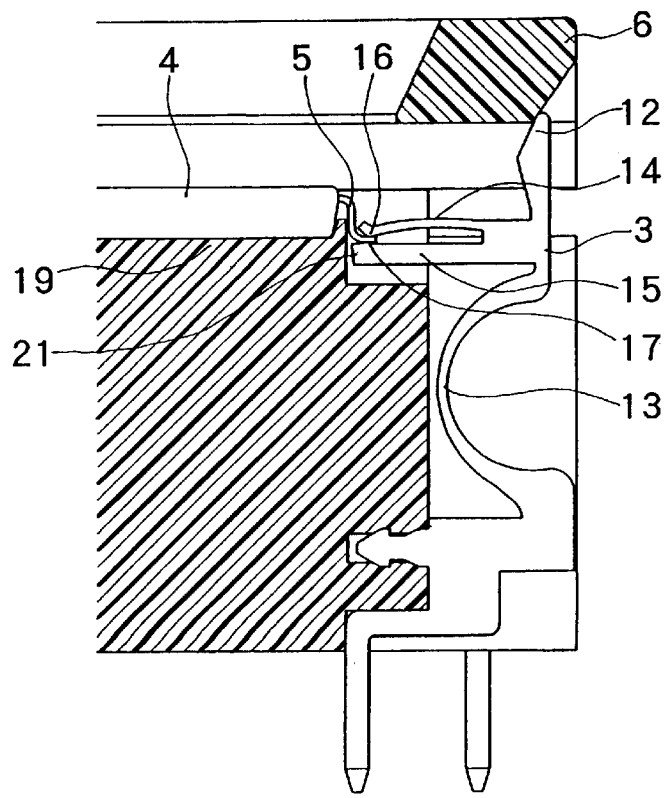

As shown in FIG. 3(B), when the force for depressing the contact opening/closing member 6 is removed, the contact 3 is forwardly resiliently displaced by the restoring force of the first spring 13 while pushing up the opening/closing member 6.

This forward resilient displacement of the contact 3 causes the distal end of the terminal 5 to abut between the distal end of the upper contact piece 14 and the distal end of the lower contact piece 15. When the contact 3 is caused to be continuously forwardly resiliently displaced, the terminal 5 is pinchingly held under pressure between the upper contact piece 14 and the lower contact piece 15 are forcibly opened while the contact pieces 14, 15 by the terminal 5.

At that time, as shown in FIG. 3(B), the contact portions 16, 17 are slid from the distal end of the terminal towards its basal portion with the upper and lower surfaces of the terminal 5 pinchingly held between the contact portions 16 and 17, whereby the upper and lower contact pieces 14, 15 exhibit a wiping action along the terminal 5.

In FIG. 3(A), when the terminal 5 of the IC package 4 is placed on the terminal support portion 21 formed on the distal end of the lower contact piece 15, a gap 22 is formed between the upper surface of the IC support base 19 and the IC package 4, whereby the IC package 4 is supported by the IC support base 19 in a floating manner.

As shown in FIG. 3(B), when the terminal 5 is pinchingly held under pressure between the upper contact piece 14 and the lower contact piece 15, the upper and lower contact pieces 14, 15 are pivoted slantwise forwardly downwardly such that the upper contact piece 14 pushes the terminal downwardly while holding the terminal 5 between the upper contact piece 14 and the lower contact piece 15, whereby the IC package 4 is lowered and supported by the upper surface of the IC support base 19. This further enhances the wiping action.

In the state of FIG. 3(B), when the opening/closing member 6 is lowered, the contact 3 is displaced backwardly to cause the upper and lower contact pieces 14, 15 to be displaced backwardly while sliding on the upper and lower surfaces of the terminal 5, whereby the contact 3 exhibits a wiping action again with respect to the upper and lower surfaces of the terminal 5. A backward displacement of the contact 3 cancels the contacted relation with the IC terminal S and opens the IC receiving portion, so that the IC package 4 can be removed.

In the embodiment of FIG. 3, the upper contact piece 14 is a contact piece of a structure capable of being displaced vertically resiliently and the lower contact piece 15 is a contact piece of a rigid structure. The terminal 5 is pinching 14 held under pressure and released from that state by vertically resiliently displacing only the upper contact piece 14.

The example using the cam member 18 will be described with reference to FIG. 4 and the example for vertically resiliently displacing the upper contact piece 14 will be described with reference to FIG. 3.

As previously mentioned, the upper and lower contact pieces 14, 15 are forwardly displaced by the restoring force of the first spring portion 13, and the upper and lower contact pieces 14, 15 are held in closed position for standby where resilient force is accumulated in the contact pieces 14, 15.

Figure 4A:
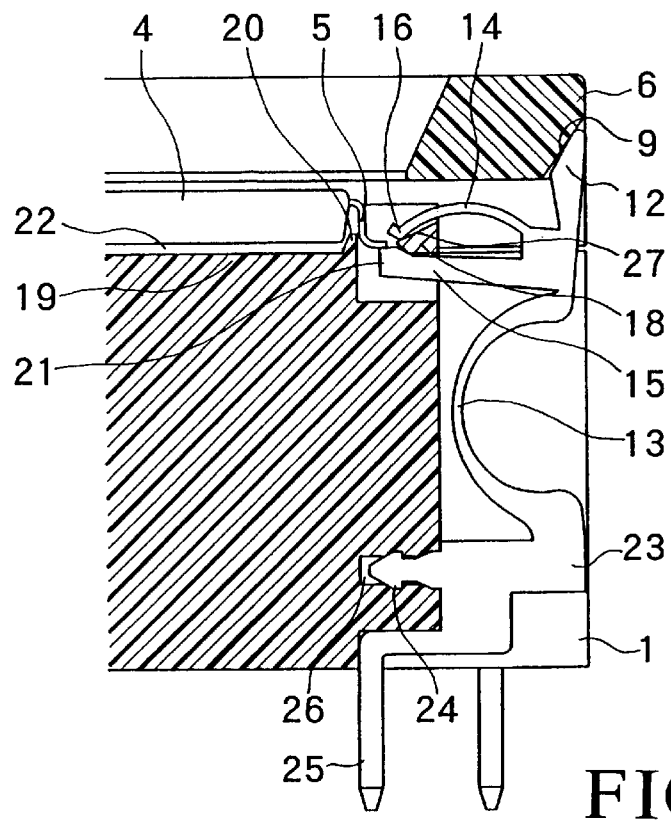
FIGS. 4(A) and 4(B) are partially sectional side views showing a fourth embodiment of the present invention, namely, an IC socket for opening/closing an upper contact piece using a cam member, according a sequential operation.

In the standby state, as shown in FIG. 4(A), the contact opening/closing member 6 is lowered to displace the contact 3 backwardly so that the IC receiving portion 2 is opened.

That is, the first spring portion 13 is flexed backwardly against its resiliency, to thereby backwardly displace the upper and lower contact pieces 14, 15, which are supported by the first spring portion 13, in synchronism, so that the IC receiving portion 2 is opened.

As previously mentioned, the cam member 18 is disposed proximate to the contact portions 16, 17, between the upper contact piece 14 and the lower contact piece 15. This cam member 18 is integral with the socket body 1 in such a manner as to extend along each array of contacts 3. And the cam member 18 is interposed between the upper contact piece 14 and the lower contact piece 15 as mentioned above.

For example, as shown in FIG. 2(A'), the IC support base 19 is provided with the cam member 18 having a contact piece restricting groove 28 for receiving therein the upper and lower contact pieces 14, 15 of each contact 3 at an area confronting the upper and lower contact pieces 14, 15. The upper and lower contact pieces 14, 15 are received in the contact piece restricting groove 28 and a cam face 27 is formed on the inner bottom surface of the groove 28, so that the upper and lower contact pieces 14, 15 are opened and closed.

The cam member 18 is provided on its upper and lower surfaces with a slanted cam face 27 which is rising backwardly, that is which is downwardly and forwardly slanted. When the contact 3 is displaced backwardly together with the upper and lower contact pieces 14, 15, the contact portions 16, 17 of the upper and lower contact pieces 14, 15 are downwardly resiliently displaced as guided by the slanted cam faces 27 such that the upper contact piece 14 is resiliently upwardly displaced, whereby the upper and lower contact pieces 14 and 15 are opened.

The upper and lower contact pieces 14, 15 are in their closed position when they are moved away from the forward end of the cam member 18. In this closed position, the contact portions 16, 17 are caused to climb over the slanted cam faces 27 when the contact 3 is displaced backwardly, whereby the above-mentioned opened state is realized.

As shown in FIG. 4(A), the IC package 4 is received in the IC receiving portion 2 through the central opening 7.

As previously mentioned, the IC receiving portion 2 is provided on its bottom portion with the IC support base 19. The lower surface of the IC package 4 is supported by the upper surface of the IC support base 19 or the terminal 5 is placed on the terminal support portion 21 provided on the lower contact piece 15 as illustrated. Positioning ridges 20 are provided along the two or four opposing sides of the IC support base 19, so that the side surfaces of the IC package 4 are restricted by the positioning ridges 20. The terminals 5 projecting from the side surfaces of the IC package 4 allow their distal end portions to project outwardly over the positioning ridges 20.

Figure 4B:
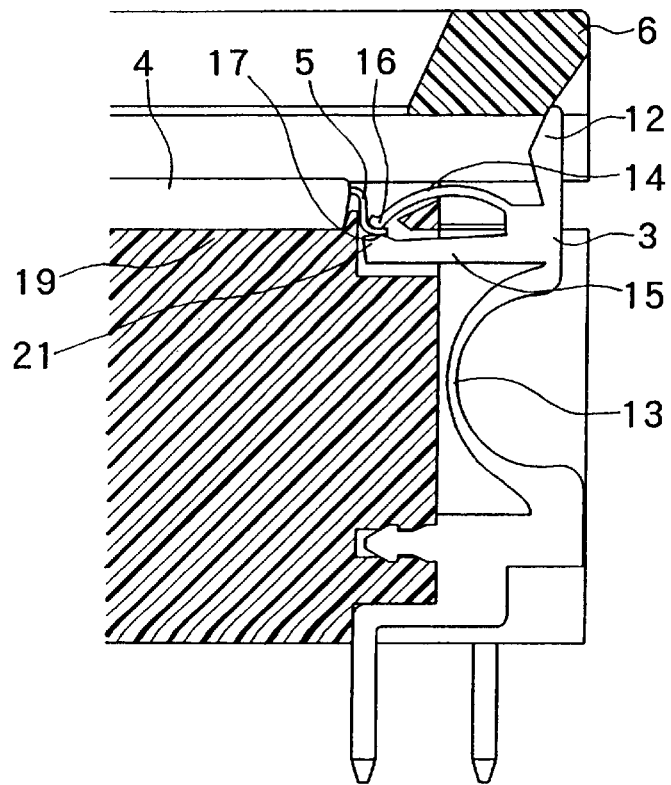

Then, as shown in FIG. 4(B), when the force for depressing the contact opening/closing member 6 is removed, the contact 3 is forwardly resiliently displaced by the restoring force of the first spring 13 while pushing up the opening/closing member 6.

This forward resilient displacement of the contact 3 causes the contact portions 16, 17 of the upper and lower contact pieces 14, 15 to be slid forwardly on the slanted cam face of the cam member 18, and the upper contact piece 14 is downwardly resiliently displaced by the restoring force thereof, thereby pinchingly holding the upper and lower surfaces of the distal end portion of the terminal S between the contact portions 16, 17 of the upper and lower contact pieces 14, 14 at a location away from the distal end of the cam member 18.

When the contact 3 is continuously forwardly resiliently displaced, as shown in FIG. 1(D'), the contact portions 16, 17 are slid from the distal end of the terminal toward the basal portion while pinchingly holding under pressure the upper and lower surfaces of the terminal 5 between the contact portion 16 and the contact portion 17, whereby a wiping action is exhibited.

Figure 6A:
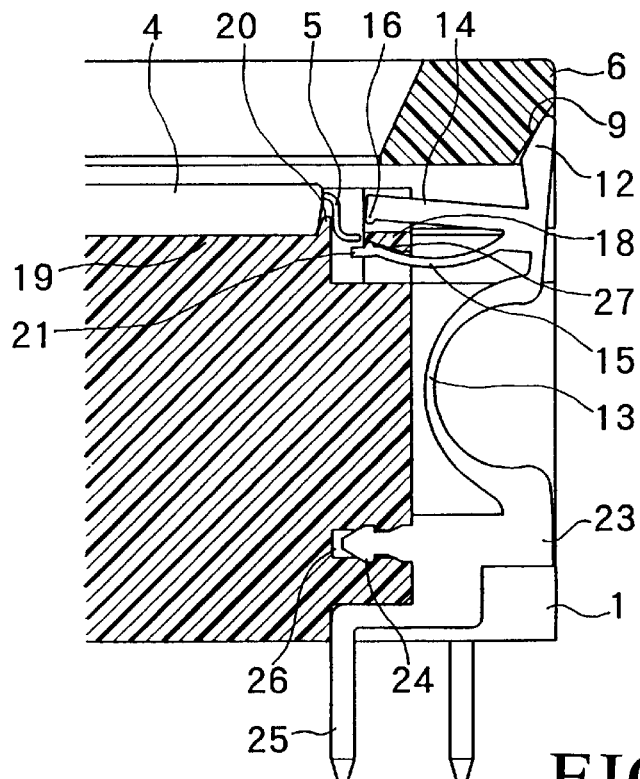
FIGS. 6(A) and 6(B) are partially sectional side views showing a sixth embodiment of the present invention, namely, an IC socket for opening/closing a lower contact piece using a cam member, according to sequential operation.

In FIG. 6(A), when the terminal 5 of the IC package 4 is placed on the terminal support portion 21 provided on the distal end of the lower contact piece 15, a gap 22 is formed between the upper surface of the IC support base 19 and the IC package 4, whereby the IC package 4 is supported by the IC support base 19 in a floating manner.

Then, as shown in FIG. 4(B), when the terminal 5 is pinchingly held under pressure between the upper contact piece 14 and the lower contact piece 15, the upper and lower contact pieces 14, 15 are pivoted slantwise forwardly downwardly such that the upper contact piece 14 pushes the terminal 5 downwardly while holding the terminal 5 between the upper contact piece 14 and the lower contact piece 15, whereby the IC package 4 is lowered and supported by the upper surface of the IC support base 19. This further enhances the wiping action.

In the state of FIG. 4(B), when the opening/closing member 6 is lowered, the contact 3 is displaced backwardly to thereby cause the upper and lower contact pieces 14, 15 to be displaced backwardly while sliding on the upper and lower surfaces of the terminal 5, whereby a wiping action is exhibited again with respect to the upper and lower surfaces. When the contact 3 is displaced backwardly, the contacted relation with the IC terminal 5 is canceled and the IC receiving portion 2 is opened, so that the IC package 4 can be removed.

Another embodiment of the present invention will now be described in more detail with reference to FIGS. 5 and 6. FIGS. 5 and 6 show a sequence of operation in cases in which the lower contact piece 15 is vertically resiliently displaceable, with FIG. 6 showing an example in which the upper contact piece 14 is vertically displaced by the cam member 18, and FIG. 5 showing another example in which the cam member 18 is not employed.

Figure 5A:
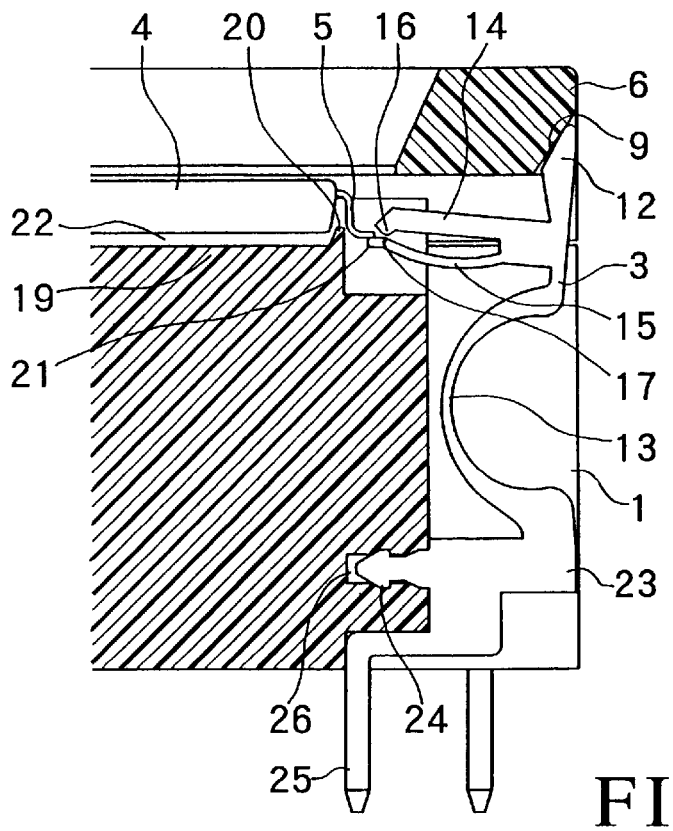
FIGS. 5(A) and 5(B) are partially sectional side views showing a fifth embodiment of the present invention, namely, an IC socket for opening/closing a lower contact piece without using a cam member, according to a sequential operation.

As previously mentioned, the upper and lower contact pieces 14, 15 are forwardly displaced for standby by the restoring force of the first spring portion 13. In that state, as shown in FIG. 5(A), the contact opening/closing member 6 is lowered to cause the contact 3 to be displaced backwardly so that the IC receiving portion 2 is opened.

That is, the first spring portion 13 is flexed backwardly against its resiliency, to thereby displace the upper and lower contact pieces 14, 15 supported by this first spring portion 13 backwardly in synchronism, so that the IC receiving portion 2 is opened. Then, the IC package 4 is received in the IC receiving portion 2 through the central opening 2.

When the IC package 4 is received in the IC receiving portion 2, the lower surface of the IC package 4 is supported by the upper surface of the IC support base 19 as previously mentioned, or the terminal 5 is placed on the terminal support portion 21 provided on the lower contact piece 15 as illustrated. The IC support base 19 is provided along its two or four opposing sides with the positioning ridges 20 so that the side surfaces of the IC package 4 are restricted by the positioning ridges 20. The terminals 5 projecting from the side surfaces of the IC package 4 allow their distal end portions to project outwardly over the positioning ridges 20.

Figure 5B:
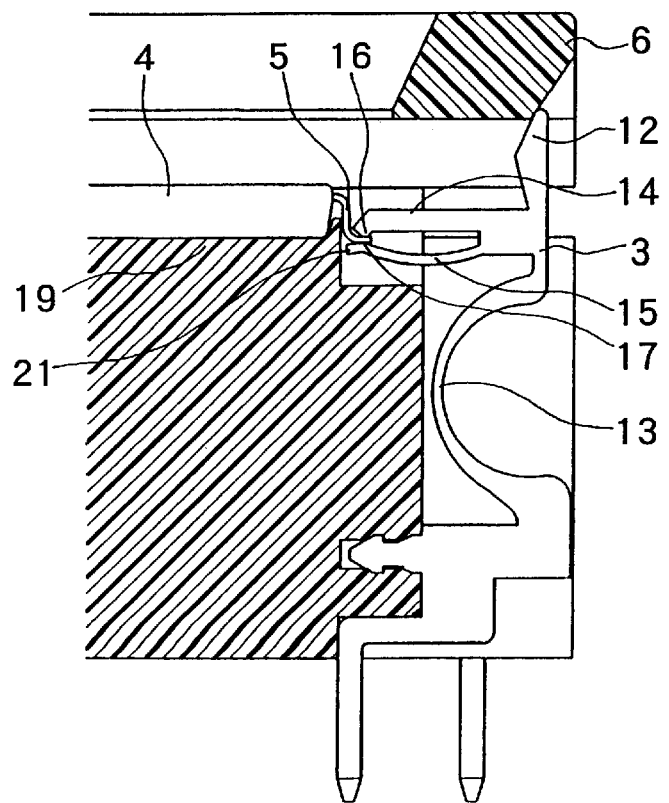

As shown in FIG. 5(B), when the when the force for depressing the contact opening/closing member 6 is removed, the contact 3 is forwardly resiliently displaced by the restoring force of the first spring 13 while pushing up the opening/closing member 6.

This forward resilient displacement of the contact 3 causes the distal end of the terminal 5 to abut between the distal end of the upper contact piece 14 and the distal end of the lower contact piece 15. When the contact 3 is caused to be continuously forwardly resiliently displaced, the terminal 5 is pinchingly held under pressure between the upper contact piece 14 and the lower contact piece 15 are forcibly opened while the contact pieces 14, 15 by the terminal 5.

At that time, as shown in FIG. 5(B), the contact portions 16, 17 are slid from the distal end of the terminal towards its basal portion with the upper and lower surfaces of the terminal 5 pinchingly held between the contact portions 16 and 17, whereby the upper and lower contact pieces 14, 15 exhibit a wiping action.

In FIG. 5(A), when the terminal 5 of the IC package 4 is placed on the terminal support portion 21 formed on the distal end of the lower contact piece 15, a gap 22 is formed between the upper surface of the IC support base 19 and the IC package 4, whereby the IC package 4 is supported by the IC support base 19 in a floating manner.

As shown in FIG. 5(B), when the terminal 5 is pinchingly held under pressure between the upper contact piece 14 and the lower contact piece 15, the upper and lower contact pieces 14, 15 are pivoted slantwise forwardly downwardly such that the upper contact piece 14 pushes the terminal downwardly while holding the terminal 5 between the upper contact piece 14 and the lower contact piece 15, whereby the IC package 4 is lowered and supported by the upper surface of the IC support base 19. This further enhances the wiping action.

In the state of FIG. 5(B), when the opening/closing member 6 is lowered, the contact 3 is displaced backwardly to cause the upper and lower contact pieces 14, 15 to be displaced backwardly while sliding on the upper and lower surfaces of the terminal 5, whereby the contact 3 exhibits a wiping action again with respect to the upper and lower surfaces of the terminal 5. A backward displacement of the contact 3 cancels the contacted relation with the IC terminal 5 and opens the IC receiving portion, so that the IC package 4 can be removed.

In the embodiment of FIG. 5, the lower contact piece 15 is a contact piece of a structure capable being of displaced vertically resiliently and the upper contact piece 14 is a contact piece of a rigid structure. The terminal 5 is pinchingly held under pressure and released from that state by vertically resiliently displacing only the lower contact piece 15.

The example using the cam member 18 will be described with reference to FIG. 6 and the example for vertically resiliently displacing the lower contact piece 15 will be described with reference to FIG. 5.

As previously mentioned, the upper and lower contact pieces 14, 15 are forwardly displaced by the restoring force of the first spring portion 13, and the upper and lower contact pieces 14, 15 are held in closed position for standby where resilient force is accumulated in the contact pieces 14, 15.

In the standby state, as shown in FIG. 6(A), the contact opening/closing member 6 is lowered to displace the contact 3 backwardly so that the IC receiving portion 2 is opened.

That is, the first spring portion 13 is flexed backwardly against its resiliency, to thereby backwardly displace the upper and lower contact pieces 14, 15, which are supported by the first spring portion 13, in synchronism, so that the IC receiving portion 2 is opened.

As previously mentioned, the cam member 18 is disposed proximate to the contact portions 16, 17, between the upper contact piece 14 and the lower contact piece 15. This cam member 18 is integral with the socket body 1 in such a manner as to extend along each array of contacts 3. And the cam member 18 is interposed between the upper contact piece 14 and the lower contact piece 15.

For example, as shown in FIG. 2(A'), the IC support base 19 is provided with the cam member 18 having a contact piece restricting groove 28 for receiving therein the upper and lower contact pieces 14, 15 of each contact 3 at an area confronting the upper and lower contact pieces 14, 15. The upper and lower contact pieces 14, 15 are received in the contact piece restricting groove 28 and a cam face 27 is formed on the inner bottom surface of the groove 28, so that the upper and lower contact pieces 14, 15 are opened and closed.

The cam member 18 is provided on its lower surface with a slanted cam face 27 which is downwardly and backwardly slanted, that is, which is slanted risingly rewardly and forwardly. When the contact 3 is displaced backwardly together with the upper and lower contact pieces 14, 15, the contact portion 17 of the lower contact piece 5 is downwardly resiliently displaced as guided by the slanted cam face 27, whereby the upper and lower contact pieces 14 and 15 are opened.

The upper and lower contact pieces 14, 15 are in their closed position when they are moved away from the forward end of the cam member 18. In this closed position, the contact portion 17 is caused to climb over the slanted cam face 27 when the contact 3 is displaced backwardly, whereby the above-mentioned opened state is realized.

Figure 6B:
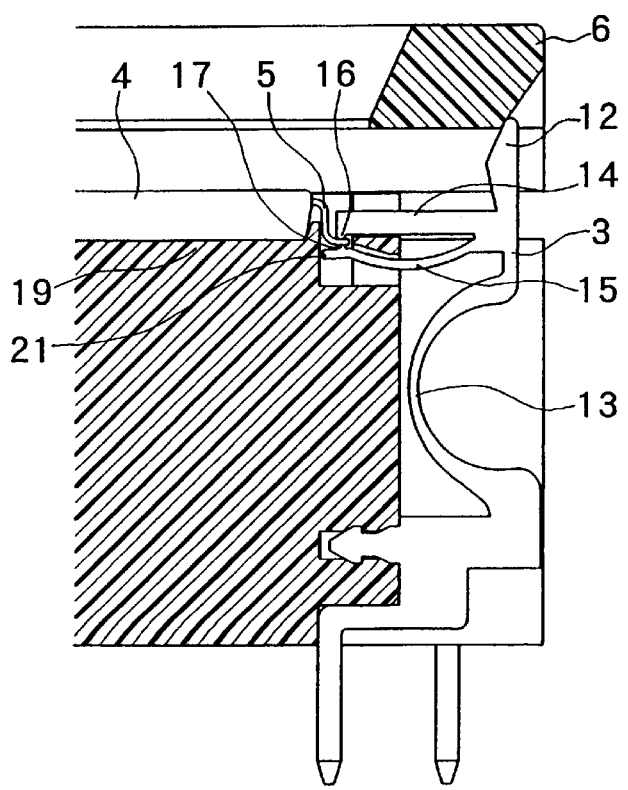

As shown in FIG. 6(B), the IC package 4 is received in the IC receiving portion 2 through the central opening 7.

As previously mentioned, the IC receiving portion 2 is provided on its bottom portion with the IC support base 19. The lower surface of the IC package 4 is supported by the upper surface of the IC support base 19 or the terminal 5 is placed on the terminal support portion 21 provided on the lower contact piece 15 as illustrated. Positioning ridges 20 are provided along the two or four opposing sides of the IC support base 19, so that the side surfaces of the IC package 4 are restricted by the positioning ridges 20. The terminals 5 projecting from the side surfaces of the IC package 4 allow their distal end portions to project outwardly over the positioning ridges 20.

Then, as shown in FIG. 6(B), when the force for depressing the contact opening/closing member 6 is removed, the contact 3 is forwardly resiliently displaced by the restoring force of the first spring 13 together with the upper and lower contact pieces 14, 15, while pushing up the opening/closing member 6.

This forward resilient displacement of the contact 3 causes the contact portion 17 of the lower contact piece 15 to be slid forwardly on the slated cam face 27 of the cam member 18, and the lower contact piece 15 is upwardly resiliently displaced by the restoring force thereof, thereby pinchingly holding the upper and lower surfaces of the distal end portion of the terminal 5 between the contact portions 16, 17 of the upper and lower contact pieces 14, 15 at a location away from the distal end of the cam member 18.

When the contact 3 is continuously forwardly resiliently displaced, as shown in FIG. 1(D'), the contact portions 16, 17 are slid from the distal end of the terminal toward the basal portion while pinchingly holding under pressure the upper and lower surfaces of the terminal 5 between the contact portion 16 and the contact portion 17, whereby a wiping action is exhibited.

In FIG. 6(A), when the terminal 5 of the IC package 4 is placed on the terminal support portion 21 provided on the distal end of the lower contact piece 15, a gap 22 is formed between the upper surface of the IC support base 19 and the IC package 4, whereby the IC package 4 is supported by the IC support base 19 in a floating manner.

Then, as shown in FIG. 6(B), when the terminal 5 is pinchingly held under pressure between the upper contact piece 14 and the lower contact piece 15, the upper and lower contact pieces 14, 15 are pivoted slantwise forwardly and downwardly such that the upper contact piece 14 pushes the terminal 5 downwardly while holding the terminal 5 between the upper contact piece 14 and the lower contact piece 15, whereby the IC package 4 is lowered and supported by the upper surface of the IC support base 19. This further enhances the wiping action.

In the state of FIG. 6(B), when the opening/closing member 6 is lowered, the contact 3 is displaced backwardly to thereby cause the upper and lower contact pieces 14, 15 to be displaced backwardly while sliding on the upper and lower surfaces of the terminal 5, whereby a wiping action is exhibited again with respect to the upper and lower surfaces. When the contact 3 is displaced backwardly, the contacted relation with the IC terminal 5 is canceled and the IC receiving portion 2 is opened, so that the IC package 4 can be removed.

The present invention can appropriately realize a two-point contacted-relation by displacing the upper and lower contact pieces forwardly and backwardly by a single common spring portion in synchronism. By this, the line length of the spring portions can be designed as uniformly as possible to enhance the reliability for the two-point contacted-relation. In addition, the contacts and the socket can be designed small in size and a wiping action can easily be obtained with respect to both or one of the upper and lower surfaces of the terminals. That is, when displacing forwardly by a single common first spring portion, both or one of the upper and lower contact pieces is slid on both or one of the upper and lower surfaces of the terminal, thereby exhibiting a wiping action.

Moreover, by providing the terminal support portion projecting beyond the distal end of the upper contact piece and adapted to support the lower surface of the terminal on the distal end of the lower contact piece, a proper corresponding relation between each terminal and each upper and lower contact piece can be realized when the IC package is placed in the receiving portion.

Furthermore, the upper and lower contact pieces are positively opened and closed by the cam member, whereby the above two-point contacted-relation can be established.

Obviously, numerous modifications and variations of the present invention are possible in light of the above teachings. It is therefore to be understood that within the scope of the appended claims, the invention may be practiced otherwise than as specifically described herein.

What is claimed is:

1. An IC socket comprising:
   a socket body having an IC package receiving portion adapted to receive an IC package having IC terminals;
   a plurality of resilient contacts arranged in array along said IC package receiving portion;
   wherein each of said contacts includes upper and lower contact pieces for pinchingly contacting the corresponding IC terminal, and a resiliently displaceable common first spring portion supporting both of said upper and lower contact pieces;
   wherein, for each of said contacts, said resiliently displaceable common first spring portion is resiliently displaceable forwardly and rearwardly to simultaneously displace said upper and lower contact pieces between a forward position in which the upper and lower contact pieces are disposed in a forward position for pinchingly contacting the corresponding IC terminal when the IC package is received in the IC receiving portion, and a rearward position in which the upper and lower contact pieces are disposed in a rearward position for canceling contact with the corresponding IC terminal; and
   wherein, for each of said contacts, at least one of said upper and lower contact pieces is resiliently displaceable upwardly and downwardly so as to constitute a second spring portion resiliently displaceable independently of said first spring portion.

2. An IC socket according to claim 1, wherein
   for each of said contacts, said common first spring portion constitutes an elongated spring portion, and said upper and lower contact pieces are secured at an end portion of said elongated spring portion.

3. An IC socket according to claim 1, wherein
   each of said contacts further includes a base portion fixed to said socket body; and
   for each of said contacts, said common first spring portion is fixed to and extends upwardly from said base portion.

4. An IC socket according to claim 1, further comprising
   means for resiliently displacing said common first spring portion of each of said contacts forwardly and rearwardly to cause said upper and lower contact pieces to be displaced between said forward and rearward positions thereof.

5. An IC socket according to claim 1, further comprising
   a contact opening/closing member mounted on said socket body and movable upwardly and downwardly for resiliently displacing said common first spring portion of each of said contacts forwardly and rearwardly to cause said upper and lower contact pieces to be displaced between said forward and rearward positions thereof.

6. An IC socket according to claim 5, wherein
   each of said contacts further includes a pressure receiving portion engageable with said contact opening/closing member.

7. An IC socket according to claim 1, wherein
   for each of said contacts, said upper and lower contact pieces extend forwardly from said common first spring portion.

8. An IC socket according to claim 7, wherein
   for each of said contacts, said lower contact piece is provided at a distal end thereof with a terminal support portion projecting forwardly beyond a distal end of said upper contact piece and adapted to support a lower surface of the corresponding IC terminal.

9. An IC socket according to claim 1, wherein
   for each of said contacts, said upper and lower contact pieces are arranged so that, when the IC package is received in said IC package receiving portion, said upper and lower contact pieces will pinchingly contact the corresponding IC terminal and cause a wiping action along upper and lower surfaces, respectively, of the corresponding IC terminal while said common first spring portion is being displaced forwardly.

10. An IC socket according to claim 1, further comprising a cam member for displacing said at least one of said upper and lower contact pieces of each contact to move said upper and lower contact pieces away from one another when said common first spring portion is displaced rearwardly, and to move said upper and lower contact pieces toward each other when said common first spring portion is displaced forwardly.

11. An IC socket according to claim 1, wherein for each of said contacts, both of said upper and lower contact pieces are resiliently displaceable upwardly and downwardly independently of said common first spring portion.

12. An IC socket according to claim 1, wherein for each of said contacts, only one of said upper and lower contact pieces is resiliently displaceable upwardly and downwardly independently of said common first spring portion, the other of said upper and lower contact pieces being rigid.

* * * * *